United States Patent
Okano (10) Patent No.: US 10,784,249 B2
(45) Date of Patent: Sep. 22, 2020

(54) INTEGRATED CIRCUIT AND LAYOUT DESIGN METHOD

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hirokazu Okano, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/282,419

(22) Filed: Feb. 22, 2019

(65) Prior Publication Data
US 2020/0091132 A1 Mar. 19, 2020

(30) Foreign Application Priority Data
Sep. 18, 2018 (JP) .................................. 2018-174195

(51) Int. Cl.
*G06F 17/50* (2006.01)
*H01L 27/02* (2006.01)
*G06F 30/394* (2020.01)

(52) U.S. Cl.
CPC ........ *H01L 27/0207* (2013.01); *G06F 30/394* (2020.01)

(58) Field of Classification Search
CPC ...... G06F 30/39; G06F 30/394; G06F 30/392; G06F 30/33; G06F 30/30
See application file for complete search history.

(56) References Cited

U.S. PATENT DOCUMENTS

| | | | | |
|---|---|---|---|---|
| 6,510,549 B1* | 1/2003 | Okamura | ................ | G06F 30/39 716/119 |
| 6,760,897 B2* | 7/2004 | Arakawa | ................ | G06F 30/394 716/127 |
| 7,363,607 B2* | 4/2008 | Birch | .................... | G06F 30/394 716/113 |
| 2005/0268261 A1* | 12/2005 | Hatakeyama | ......... | G06F 30/398 716/115 |

FOREIGN PATENT DOCUMENTS

| | | |
|---|---|---|
| JP | H11-261041 A | 9/1999 |
| JP | 3119197 B2 | 12/2000 |
| JP | 2005-284838 A | 10/2005 |
| JP | 4241011 B2 | 3/2009 |

* cited by examiner

*Primary Examiner* — Nghia M Doan
(74) *Attorney, Agent, or Firm* — White & Case LLP (57) ABSTRACT

According to one embodiment, there is provided an integrated circuit including a circuit provided with terminals, a plurality of circuit blocks provided with terminals, and a plurality of wirings that run in parallel from the terminals of the circuit toward the circuit blocks and each turns in mid-course toward a position at which a terminal of a corresponding circuit block exists to connect to the terminal of the corresponding circuit block, any adjacent wirings at the terminals of the circuit being connected to different circuit blocks.

7 Claims, 8 Drawing Sheets

| No. | NUMBER OF STAGES: 2<br>NUMBER OF WIRINGS: 6 |
|---|---|
| 1 | M1, M2 / M1, M2 / M1, M2 |
| 2 | M2, M1 / M2, M1 / M2, M1 |

| No. | NUMBER OF STAGES: 3 NUMBER OF WIRINGS: 9 |
|---|---|
| 1 | M1, M2, M3 / M1, M2, M3 / M1, M2, M3 |
| 2 | M1, M3, M2 / M1, M3, M2 / M1, M3, M2 |
| 3 | M2, M1, M3 / M2, M1, M3 / M2, M1, M3 |
| 4 | M2, M3, M1 / M2, M3, M1 / M2, M3, M1 |
| 5 | M3, M1, M2 / M3, M1, M2 / M3, M1, M2 |
| 6 | M3, M2, M1 / M3, M2, M1 / M3, M2, M1 |

INTEGRATED CIRCUIT AND LAYOUT DESIGN METHOD

CROSS-REFERENCE TO RELATED APPLICATIONS

This application is based upon and claims the benefit of priority from Japanese Patent Application No. 2018-174195, filed Sep. 18, 2018, the entire contents of which are incorporated herein by reference.

FIELD

Embodiments described herein relate generally to an integrated circuit and a layout design method.

BACKGROUND

In an integrated circuit, a certain circuit (for example, a circuit corresponding to a logic area) and a plurality of circuit blocks (for example, a circuit corresponding to a macro such as a memory macro) are connected by a plurality of wirings.

In the layout design of such an integrated circuit, generally, for countermeasure against wiring concentration, wiring congestion is dissolved by dispersing wiring routes, for example, by inserting a guide buffer at an initial placement stage.

Although the wiring congestion is dissolved, many wirings run in parallel in a general layout and thus a large interline capacitance exists. Crosstalk noise or signal transmission delay corresponding to the magnitude of the interline capacitance is generated. A large crosstalk noise or signal transmission delay can cause deterioration of the operation performance of the integrated circuit.

DETAILED DESCRIPTION

Hereinafter, embodiments will be described with reference to the accompanying drawings.

In general, according to one embodiment, there is provided an integrated circuit including a circuit provided with terminals, a plurality of circuit blocks provided with terminals, and a plurality of wirings that run in parallel from the terminals of the circuit toward the circuit blocks and each turns in mid-course toward a position at which a terminal of a corresponding circuit block exists to connect to the terminal of the corresponding circuit block, any adjacent wirings at the terminals of the circuit being connected to different circuit blocks.

(Basic Configuration)

First, the outline of a basic wiring layout according to the present embodiment will be described with reference to FIGS. 1A and 1B while being compared with a general technique. A more specific example will be described later.

Figure 1A:
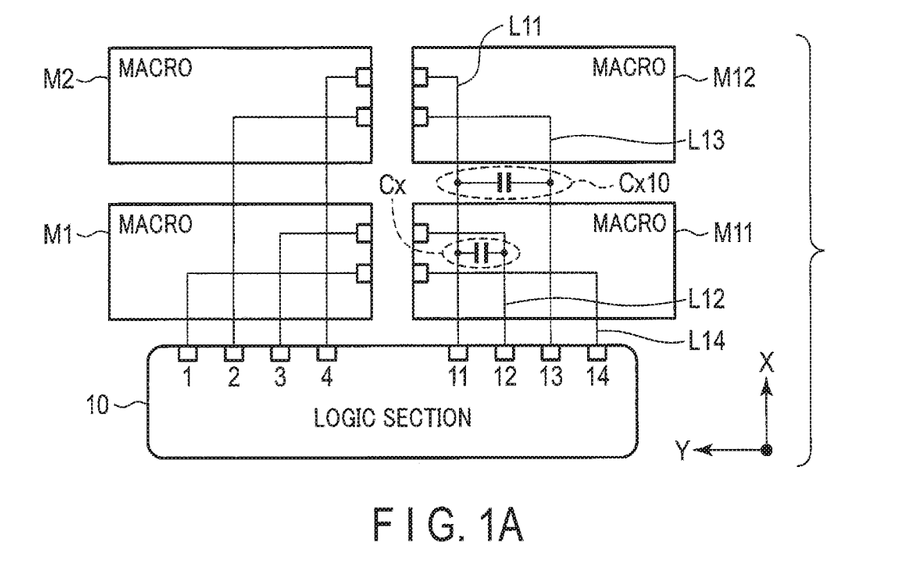
FIG. 1A is a block diagram illustrating an example of a wiring layout in which a circuit (for example, a circuit corresponding to a logic section having a logic area) and a plurality of circuit blocks (for example, a circuit corresponding to a macro such as a memory macro) are connected by a plurality of wirings in an integrated circuit according to an embodiment.

FIG. 1A is a block diagram illustrating an example of a wiring layout in which a circuit (for example, a circuit corresponding to a logic section having a logic area) and a plurality of circuit blocks (for example, a circuit corresponding to a macro such as a memory macro) are connected by a plurality of wirings in an integrated circuit according to the present embodiment. On the other hand, FIG. 1B is a diagram illustrating an example of a wiring layout according to a general technique.

Here, a case in which a logic section 10 and a plurality of macros M1, M2, M11, and M12 are connected by eight wirings will be described.

Figure 1B:
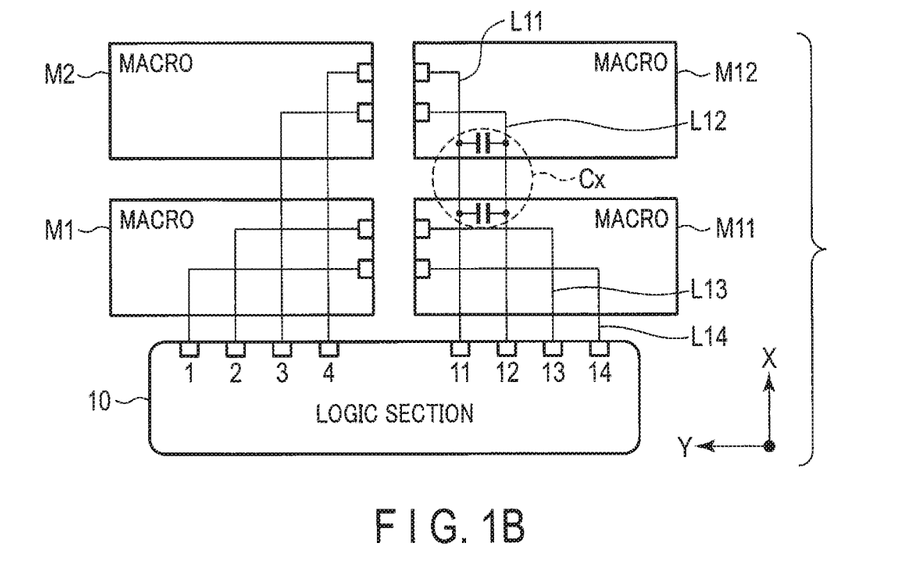
FIG. 1B is a diagram illustrating an example of a wiring layout according to a general technique.

As illustrated in FIGS. 1A and 1B, each integrated circuit includes a logic section 10 and a plurality of macros M1, M2, M11, and M12. The plurality of macros M1, M2, M11, and M12 are arranged so as to be separated from each other and are also arranged so as to be separated from the logic section 10. In addition, the plurality of macros M1, M2, M11, and M12 form a plurality of stages in an X direction and form a plurality of columns in a Y direction.

The eight wirings which connect the logic section 10 to the macros M1, M2, M11, and M12 have parallel running portions which extend from terminals 1 to 4 and 11 to 14 of the logic section 10 in the X direction and run in parallel toward the macros M1, M2, M11, and M12. The plurality of terminals for wiring connection provided at end portions of the respective macros are linearly arranged from the logic section 10 along the direction in which the individual wirings run in parallel. The eight wirings which extend from the logic section 10 side in the X direction run in parallel on the macro M1 or the like or on M11 or the like, and each turns in mid-course to the Y direction (or the opposite direction) toward a position at which the terminal of a corresponding macro exists so as to connect to the terminal of the corresponding macro.

In particular, in the example of FIG. 1A, any adjacent wirings in the parallel running portion (namely, any adjacent wirings at the terminals 1 to 4, 11 to 14 of the logic section 10) are connected to different circuit blocks. On the other hand, in the example of FIG. 1B, such a wiring layout is not established.

More specifically, in the example of FIG. 1A, the two wirings L11 and L12 which extend from the terminals 11 and 12 of the logic section 10 are connected to different macros M12 and M11, respectively. In addition, the two wirings L12 and L13 which extend from the terminals 12 and 13 of the logic section 10 are connected to different macros M11 and M12, respectively. In addition, the two wirings L13 and L14 which extend from the terminals 13 and 14 of the logic section 10 are connected to different macros M12 and M11, respectively. The plurality of wirings which extend from the terminals 1 to 4 have the same layout.

On the other hand, in the example of FIG. 1B, the two wirings L11 and L12 which extend from the terminals 11 and 12 of the logic section 10 are connected to the same macro M12. In addition, the two wirings L13 and L14 which extend from the terminals 13 and 14 of the logic section 10 are connected to the same macro M11. Only the two wirings L12 and L13 which extend from the terminals 12 and 13 of the logic section 10 are connected to different macros M12 and M11. The plurality of wirings which extend from the terminals 1 to 4 of the logic section 10 have the same layout.

From another viewpoint, in the example of FIG. 1A, it can be said that the wirings connected from the logic section 10 to the same circuit block are separately arranged so as not to be adjacent to each other in the parallel running portion (namely, so as not to be adjacent to each other at the terminals 1 to 4, 11 to 14 of the logic section 10). On the other hand, in the example of FIG. 1B, such a wiring layout is not established.

More specifically, in the example of FIG. 1A, the wirings L11 and L13 connected to the same macro M12 are wirings which extend from the terminals 11 and 13 of the logic section 10, respectively, and are separately arranged so as not to be adjacent to each other in the parallel running section. In addition, the wirings L12 and L14 connected to the same macro M11 are wirings which extend from the terminals 12 and 14 of the logic section 10, respectively, and are separately arranged so as not to be adjacent to each other in the parallel running section.

On the other hand, in the example of FIG. 1B, the wirings L11 and L12 connected to the same macro M12 are wirings which extend from the terminals 11 and 12 of the logic section 10, respectively, and are arranged so as to be adjacent to each other in the parallel running section. In addition, the wirings L13 and L14 connected to the same macro M11 are wirings which extend from the terminals 13 and 14 of the logic section 10, respectively, and are arranged so as to be adjacent to each other in the parallel running section.

(Operation Effect by Basic Configuration)

In such a configuration, attention is paid to the interline capacitance between adjacent wirings. When the width between the wirings is the same, the interline capacitance is larger between wirings having a longer parallel running distance than between wirings having a shorter parallel running distance. Among the plurality of adjacent wirings, the wirings having the longest parallel running distance have the largest interline capacitance. Hereinafter, this interline capacitance is referred to as "maximum interline capacitance Cx".

It is considered that the wiring portion having the maximum interline capacitance Cx is a portion which causes particularly large crosstalk noise and signal transmission delay, makes timing convergence processing (processing to satisfy timing limitation) difficult, and greatly affects the operation performance of the integrated circuit.

In the example of FIG. 1A, among the plurality of adjacent wirings, the wirings L11 and L12 (and wirings L3 and L4) are the longest parallel running distance, and the interline capacitance corresponds to the maximum interline capacitance Cx.

On the other hand, in the example of FIG. 1B, among the plurality of adjacent wirings, the wirings L11 and L12 (and wirings L3 and L4) have the longest parallel running distance, and the interline capacitance corresponds to the maximum interline capacitance Cx.

In the example of FIG. 1A, the wirings L11 and L13 having a long parallel running distance are seen, but the wirings L11 and L13 are separately arranged so as not to be adjacent to each other in the parallel running portions extending from the logic section 10. Since the width between the wirings is twice the width between the wirings L11 and L12, the interline capacitance Cx10 is considerably smaller than the interline capacitance Cx of the wirings L11 and L12 in the example of FIG. 1B.

In the example of FIG. 1A, as compared with the example of FIG. 1B, since the parallel running distance from the logic section 10 of the adjacent wirings L11 and L12 (and wirings L3 and L4) is short, the maximum interline capacitance Cx is small, and the crosstalk noise and the signal transmission delay are reduced. Therefore, the operation performance of the integrated circuit can be improved by designing the wiring layout as in the example of FIG. 1A.

The following description will be given in detail with reference to some specific examples.

Configuration of Specific Example 1

A specific example of a wiring layout in a case in which the number of stages of macros is two will be described with reference to FIGS. 2A, 2B and 2C. In the present example, a case in which the number of wirings is six (the number of wirings is three for each macro) will be exemplified.

Figure 2A:
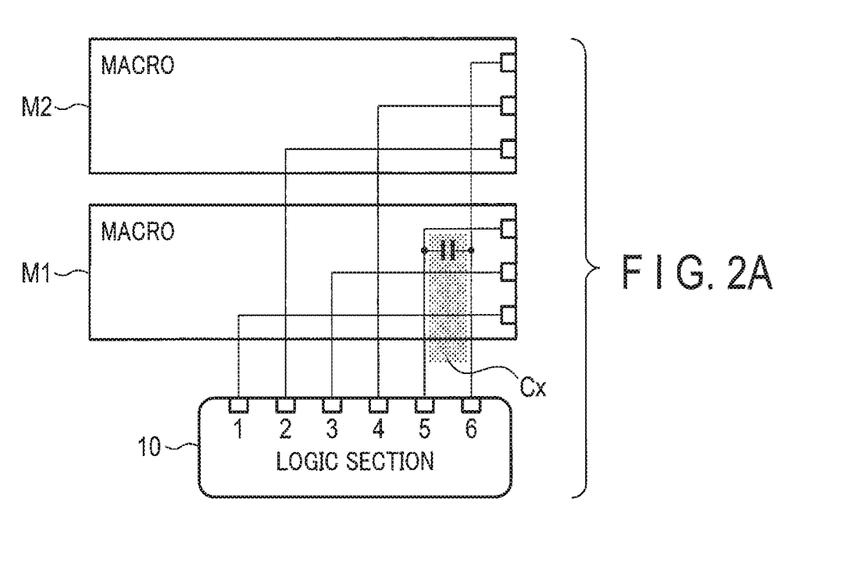
FIG. 2A is a diagram illustrating a specific example of a wiring layout in a case in which the number of stages of macros is two in the same embodiment.

FIG. 2A is a diagram illustrating a specific example of a wiring layout in a case in which the number of stages of macros is two in the present embodiment. On the other hand, FIG. 2B is a diagram illustrating a specific example of a wiring layout in a case in which the number of stages of macros is two in a general technique.

Figure 2B:
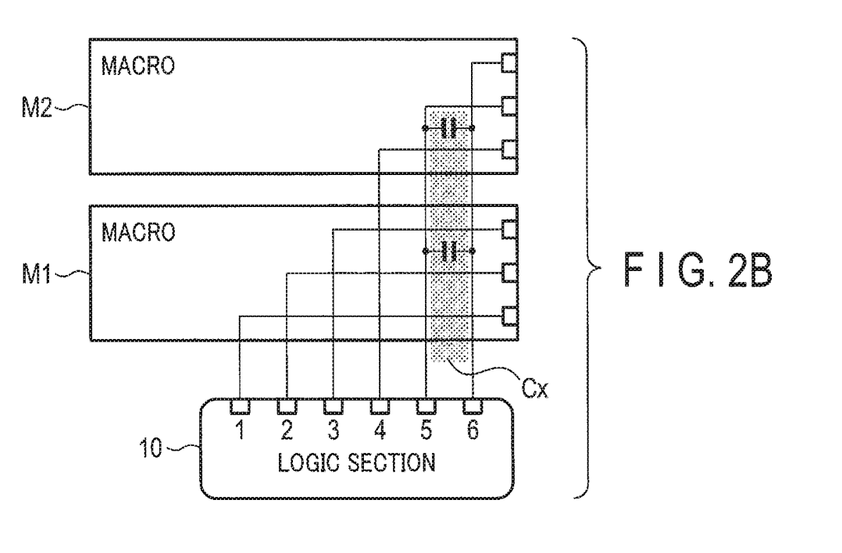
FIG. 2B is a diagram illustrating a specific example of a wiring layout in a case in which the number of stages of macros is two in a general technique.

As illustrated in FIGS. 2A and 2B, each integrated circuit includes a logic section 10 and a plurality of macros M1 and M2.

The six wirings which connect the logic section 10 to the macros M1 and M2 have parallel running portions which extend from terminals 1 to 6 of the logic section 10 and run in parallel toward the macros M1 and M2. The plurality of terminals for wiring connection provided at end portions of the respective macros are linearly arranged from the logic section 10 along the direction in which the individual wirings run in parallel. The six wirings which extend from the logic section 10 side run in parallel on the macro M1 or the like, and each turns in mid-course toward a position at which the terminal of a corresponding macro exists so as to connect to the terminal of the corresponding macro.

In the example of FIG. 2A, any adjacent wirings in the parallel running portion (namely, any adjacent wirings at the terminals 1 to 6 of the logic section 10) are connected to different circuit blocks. On the other hand, in the example of FIG. 2B, such a wiring layout is not established. From another viewpoint, in the example of FIG. 2A, it can be said that the wirings connected from the logic section 10 to the same circuit block are separately arranged so as not to be adjacent to each other in the parallel running portion (namely, so as not to be adjacent to each other at the terminals 1 to 6 of the logic section 10). On the other hand, in the example of FIG. 2B, such a wiring layout is not established.

Wiring Method of Specific Example 1

In a case in which the number of stages of macros is two and the number of wirings is six (the number of wirings is three for each macro), the invention is not limited to the example of FIG. 2A and an example of two types of wiring schemes including the example of FIG. 2A can be provided. An example of two types of wiring schemes is shown in the table of FIG. 2C.

Here, a case in which the individual wirings are sequentially laid in the order of the terminals 1, 2, 3, 4, 5, and 6 of the logic section 10 is considered. In this case, for the three terminals of each macro, for example, the wirings are sequentially connected from the terminal closer to the logic section 10.

Wiring Method No. 1

Wiring method No. 1 is an example in which the connection destinations of the terminals 1, 2, 3, 4, 5, and 6 of the logic section 10 are macros M1, M2/M1, M2/M1, M2, respectively. "/" is written as a delimiter for making it easy to understand that three successive "M1, M2" are present. This also applies to the following "/".

Wiring Method No. 2

Wiring method No. 2 is an example in which the connection destinations of the terminals 1, 2, 3, 4, 5, and 6 of the logic section 10 are macros M2, M1/M2, M1/M2, M1, respectively. The wiring method No. 2 corresponds to the example of FIG. 2A.

Figure 2C:
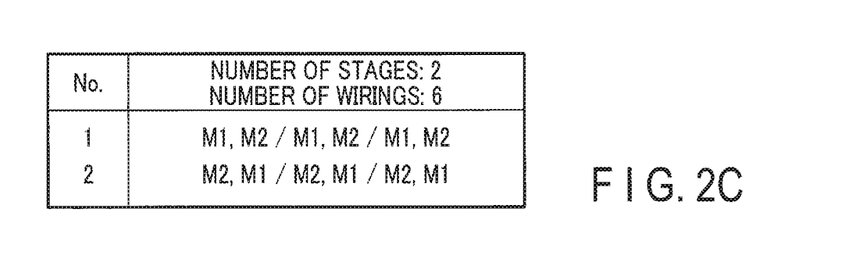
FIG. 2C is a table showing an example of two types of wiring schemes in the same embodiment.

That is, in various wiring schemes illustrated in FIG. 2C, there are no portions in which M1 is successive, such as "M1, M1" or "M1/M1", and there is no portions in which M2 is successive, such as "M2, M2" or "M2/M2". Therefore, any adjacent wiring in the parallel running portion (namely, any adjacent wirings at the terminals 1 to 6 of the logic section 10) are connected to different circuit blocks. In addition, the wirings connected from the logic section 10 to the same circuit block are separately arranged so as not to be adjacent to each other in the parallel running portion (namely, so as not to be adjacent to each other at the terminals 1 to 6 of the logic section 10).

Any of the various wiring schemes illustrated in FIG. 2C may be adopted, but in order to further enhance the operation performance of the integrated circuit, those having the largest maximum interline capacitance Cx can be excluded from candidates among the various wiring schemes, and those having the smallest maximum interline capacitance Cx may be adopted among the various wiring schemes.

Operation Effect by Specific Example 1

In the example of FIG. 2A, among the plurality of adjacent wirings, the wirings which extend from the terminals 5 and 6 of the logic section 10 or the wirings which extend from the terminals 4 and 5 have the longest parallel running distance, and the interline capacitance corresponds to the maximum interline capacitance Cx.

On the other hand, in the example of FIG. 2B, among the plurality of adjacent wirings, the wirings which extend from the terminals 5 and 6 of the logic section 10 have the longest parallel running distance, and the interline capacitance corresponds to the maximum interline capacitance Cx.

It can be estimated that, in the example of FIG. 2A, the two wirings which extend from the terminals 5 and 6 of the logic section 10 run substantially in parallel for "one macro", and in the example of FIG. 2B, the two wirings which extend from the terminals 5 and 6 of the logic section 10 run substantially in parallel for "two macros".

Since the maximum interline capacitance Cx in the example of FIG. 2A is about one half of that in the example of FIG. 2B, the crosstalk noise and the signal transmission delay are reduced by that amount. Therefore, in a case in which the number of stages of macros is two and the number of wirings is six (the number of wirings is three for each macro), the operation performance of the integrated circuit can be improved by designing the wiring layout as in the example of FIG. 2A. This is not limited to the example of FIG. 1A, and it can be said that this is almost common to the various methods listed in FIG. 2C.

Configuration of Specific Example 2

A specific example of a wiring layout in a case in which the number of stages of macros is three will be described with reference to FIGS. 3A, 3B, 3C, and 3D. In the present example, a case in which the number of wirings is nine (the number of wirings is three for each macro) will be exemplified.

Figure 3A:
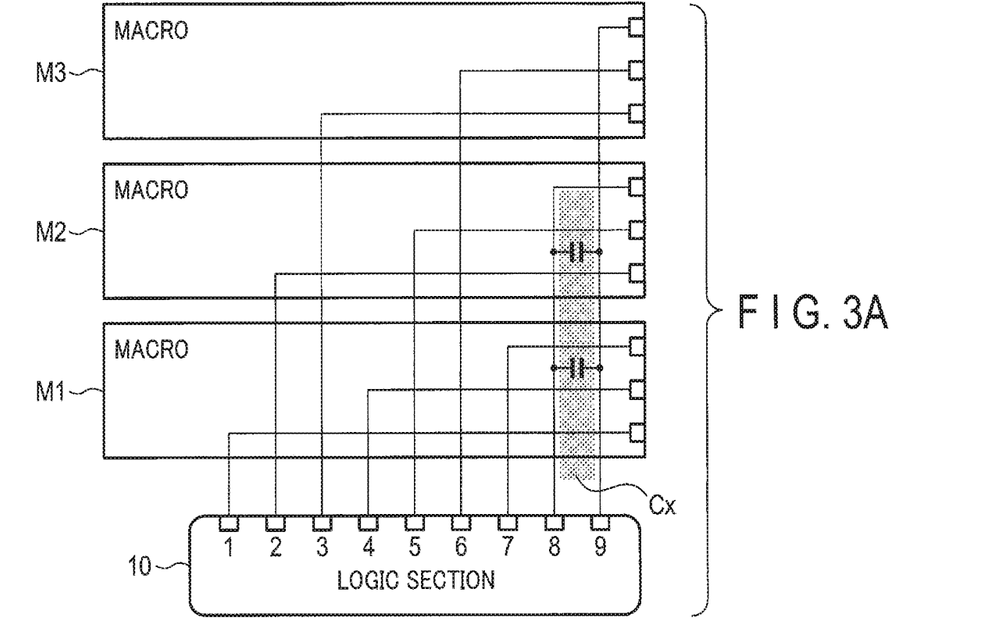
FIG. 3A is a diagram illustrating a specific example of a wiring layout in a case in which the number of stages of macros is three in the same embodiment.
Figure 3B:
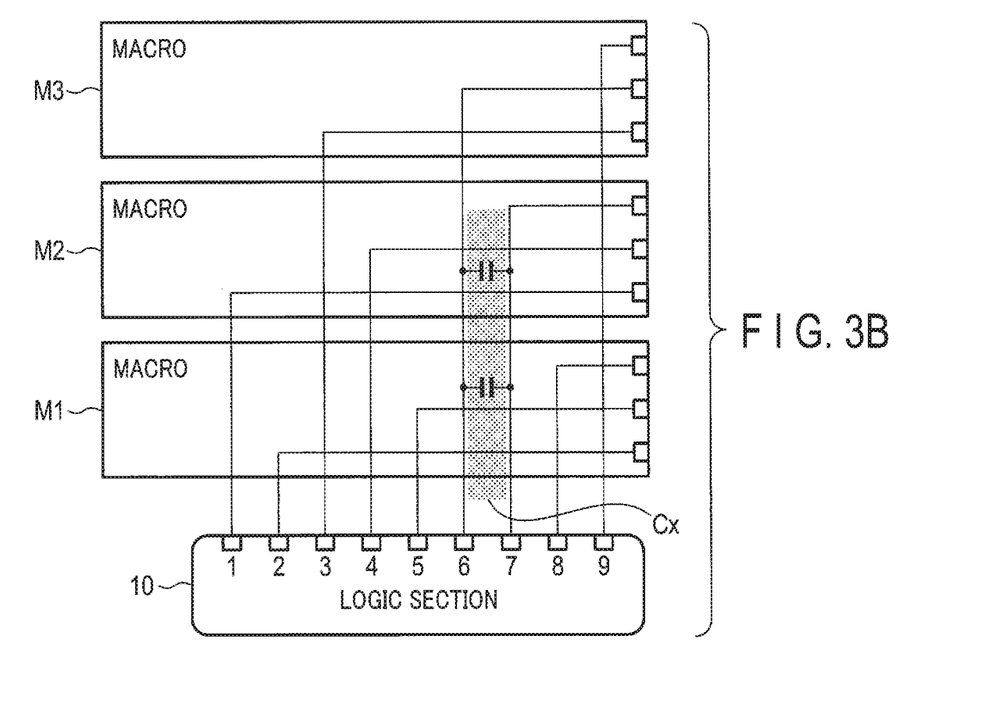
FIG. 3B is a diagram illustrating another specific example of a wiring layout in a case in which the number of stages of macros is three in the same embodiment.

FIG. 3A is a diagram illustrating a specific example of a wiring layout in a case in which the number of stages of macros is three in the present embodiment. FIG. 3B is a diagram illustrating another specific example of a wiring layout in a case in which the number of stages of macros is three in the present embodiment. On the other hand, FIG. 3C is a diagram illustrating a specific example of a wiring layout in a case in which the number of stages of macros is three in a general technique.

Figure 3C:
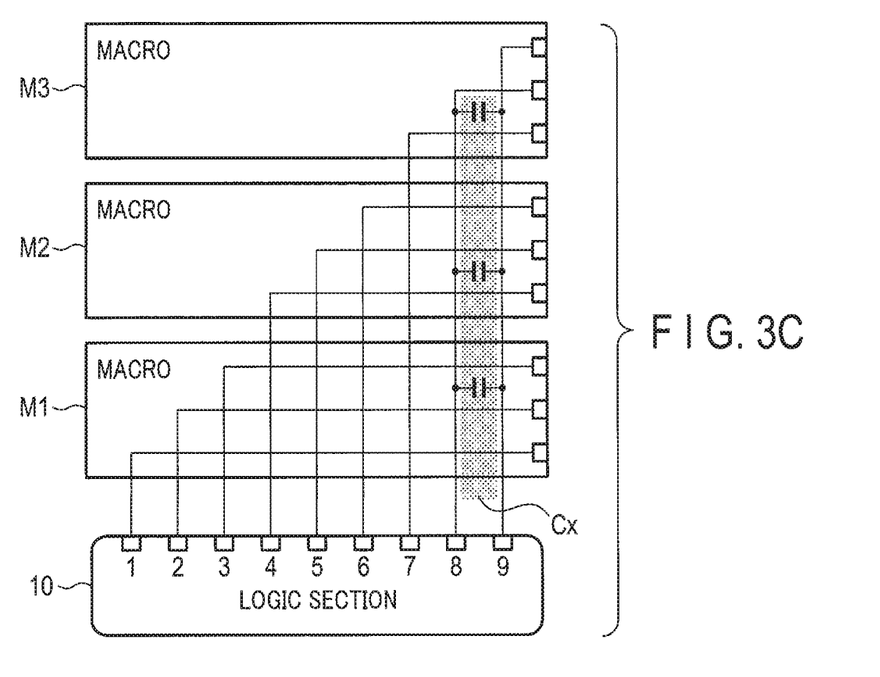
FIG. 3C is a diagram illustrating a specific example of a wiring layout in a case in which the number of stages of macros is three in a general technique.

As illustrated in FIGS. 3A, 3B, and 3C, each integrated circuit includes a logic section 10 and a plurality of macros M1, M2, and M3.

The nine wirings which connect the logic section 10 to the macros M1, M2, and M3 have parallel running portions which extend from terminals 1 to 9 of the logic section 10 and run in parallel toward the macros M1, M2, and M3. The plurality of terminals for wiring connection provided at end portions of the respective macros are linearly arranged from the logic section 10 along the direction in which the individual wirings run in parallel. The nine wirings which extend from the logic section 10 side run in parallel on the macro M1 or the like, and each turns in mid-course toward a position at which the terminal of a corresponding macro exists so as to connect to the terminal of the corresponding macro.

In the examples of FIGS. 3A and 3B, any adjacent wirings in the parallel running portion (namely, any adjacent wirings at the terminals 1 to 9 of the logic section 10) are connected to different circuit blocks. On the other hand, in the example of FIG. 3C, such a wiring layout is not established. From another viewpoint, in the examples of FIGS. 3A and 3B, it can be said that the wirings connected from the logic section 10 to the same circuit block are separately arranged so as not to be adjacent to each other in the parallel running portion (namely, so as not to be adjacent to each other at the terminals 1 to 9 of the logic section 10). On the other hand, in the example of FIG. 3C, such a wiring layout is not established.

Wiring Method of Specific Example 2

Figure 3D:
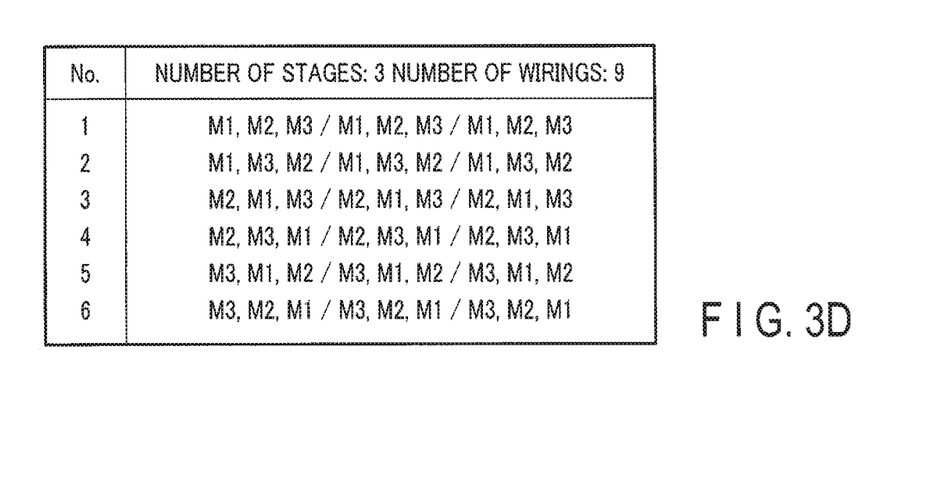
FIG. 3D is a table illustrating an example of six types of wiring schemes in the same embodiment.

In a case in which the number of stages of macros is three and the number of wirings is nine (the number of wirings is three for each macro), the invention is not limited to the examples of FIGS. 3A and 3B and an example of six (=factorial of three) types of wiring schemes including these examples can be provided. An example of six types of wiring schemes is shown in the table of FIG. 3D.

Here, a case in which the individual wirings are sequentially laid in the order of the terminals 1, 2, 3, 4, 5, 6, 7, 8, and 9 of the logic section 10 is considered. In this case, for the three terminals of each macro, for example, the wirings are sequentially connected from the terminal closer to the logic section 10.

Wiring Method No. 1

Wiring method No. 1 is an example in which the connection destinations of the terminals 1, 2, 3, 4, 5, 6, 7, 8, and 9 of the logic section 10 are macros M1, M2, M3/M1, M2, M3/M1, M2, and M3, respectively. "/" is written as a delimiter for making it easy to understand that three successive "M1, M2" are present. This also applies to the following "/". Wiring method No. 1 corresponds to the example of FIG. 3A.

Wiring Method No. 2

Wiring method No. 2 is an example in which the connection destinations of the terminals 1, 2, 3, 4, 5, 6, 7, 8, and 9 of the logic section 10 are macros M1, M3, M2/M1, M3, M2/M1, M3, M2, respectively.

Wiring Method No. 3

Wiring method No. 3 is an example in which the connection destinations of the terminals 1, 2, 3, 4, 5, 6, 7, 8, and 9 of the logic section 10 are macros M2, M1, M3/M2, M1, M3/M2, M1, M3, respectively. Wiring method No. 3 corresponds to the example of FIG. 3B.

Wiring Method No. 4

Wiring method No. 4 is an example in which the connection destinations of the terminals 1, 2, 3, 4, 5, 6, 7, 8, and 9 of the logic section 10 are macros M2, M3, M1/M2, M3, M1/M2, M3, M1, respectively.

Wiring Method No. 5

Wiring method No. 5 is an example in which the connection destinations of the terminals 1, 2, 3, 4, 5, 6, 7, 8, and 9 of the logic section 10 are macros M3, M1, M2/M3, M1, M2/M3, M1, M2, respectively.

Wiring Method No. 6

Wiring method No. 6 is an example in which the connection destinations of the terminals 1, 2, 3, 4, 5, 6, 7, 8, and 9 of the logic section 10 are macros M3, M2, M1/M3, M2, M1/M3, M2, M1, respectively.

That is, in various wiring schemes illustrated in FIG. 3D, there are no portions in which M1 is successive, such as "M1, M1" or "M1/M1", there is no portions in which M2 is successive, such as "M2, M2" or "M2/M2", and there is no portions in which M3 is successive, such as "M3, M3" or "M3/M3". Therefore, any adjacent wirings in the parallel running portion (namely, any adjacent wirings at the terminals 1 to 9 of the logic section 10) are connected to different circuit blocks. In addition, the wirings connected from the logic section 10 to the same circuit block are separately arranged so as not to be adjacent to each other in the parallel running portion (namely, so as not to be adjacent to each other at the terminals 1 to 9 of the logic section 10).

Any of the various wiring schemes illustrated in FIG. 3D may be adopted, but in order to further enhance the operation performance of the integrated circuit, those having the largest maximum interline capacitance Cx can be excluded from candidates among the various wiring schemes, and those having the smallest maximum interline capacitance Cx may be adopted among the various wiring schemes.

Operation Effect by Specific Example 2

In the example of FIG. 3A, among the plurality of adjacent wirings, the wirings which extend from the terminals 8 and 9 of the logic section 10 have the longest parallel running distance, and the interline capacitance corresponds to the maximum interline capacitance Cx. In addition, in the example of FIG. 3B, among the plurality of adjacent wirings, the wirings which extend from the terminals 6 and 7 of the logic section 10 have the longest parallel running distance, and the interline capacitance corresponds to the maximum interline capacitance Cx.

On the other hand, in the example of FIG. 3C, among the plurality of adjacent wirings, the wirings which extend from the terminals 8 and 9 of the logic section 10 have the longest parallel running distance, and the interline capacitance corresponds to the maximum interline capacitance Cx.

It can be estimated that, in the example of FIG. 3A, the two wirings which extend from the terminals 8 and 9 of the logic section 10 run substantially in parallel for "two macros", in the example of FIG. 3B, the two wirings which extend from the terminals 6 and 7 of the logic section 10 run substantially in parallel for "two macros", and in the example of FIG. 3C, the two wirings which extend from the terminals 8 and 9 of the logic section 10 run substantially in parallel for "three macros".

Since the maximum interline capacitance Cx in the examples of FIGS. 3A and 3B is about two thirds of that in the example of FIG. 3C, the crosstalk noise and the signal transmission delay are reduced by that amount. Therefore, in a case in which the number of stages of macros is three and the number of wirings is nine (the number of wirings is three for each macro), the operation performance of the integrated circuit can be improved by designing the wiring layout as in the example of FIG. 3A or FIG. 3B. This is not limited to the example of FIG. 3A or FIG. 3B, and it can be said that this is almost common to the various methods listed in FIG. 3D.

Configuration of Specific Example 3

A specific example of a wiring layout in a case in which the number of stages of macros is four will be described with reference to FIGS. 4A and 4B. In the present example, a case in which the number of wirings is twelve (the number of wirings is three for each macro) will be exemplified.

Figure 4A:
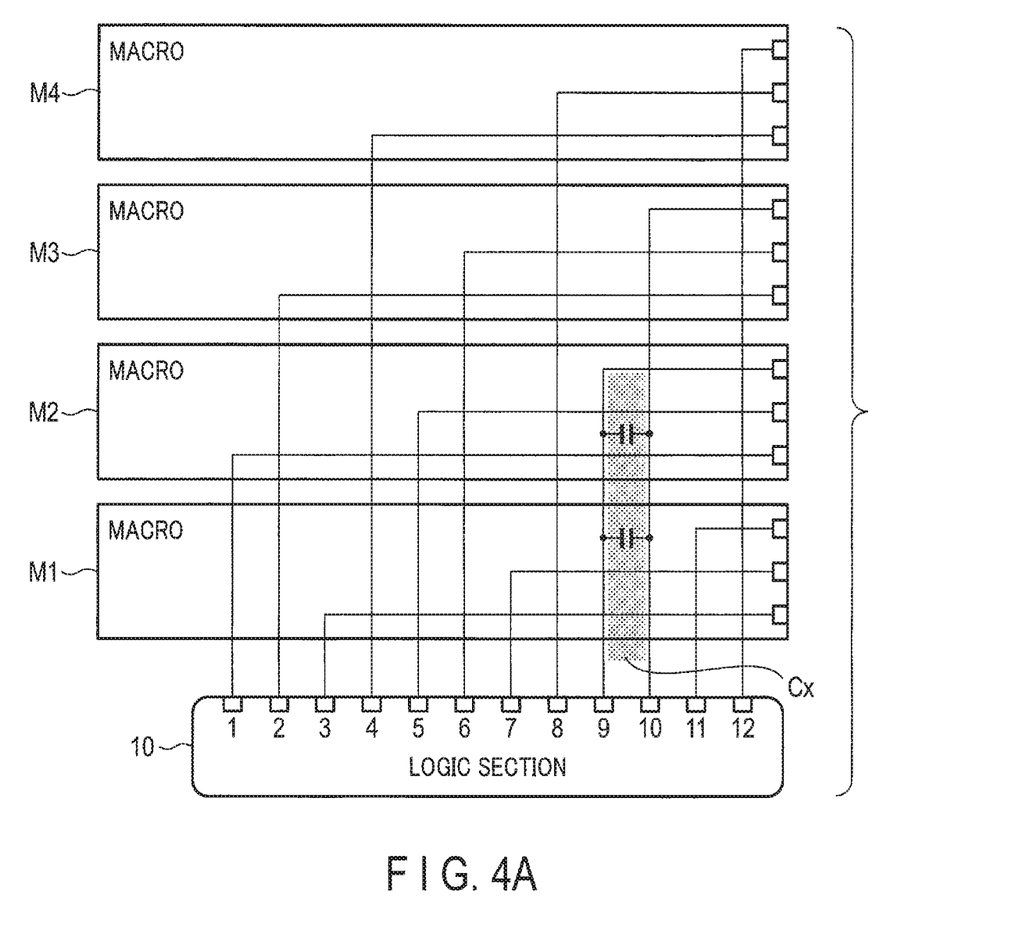
FIG. 4A is a diagram illustrating a specific example of a wiring layout in a case in which the number of stages of macros is four in the same embodiment.

FIG. 4A is a diagram illustrating a specific example of a wiring layout in a case in which the number of stages of macros is four in the present embodiment. On the other hand, FIG. 4B is a diagram illustrating a specific example of a wiring layout in a case in which the number of stages of macros is four in a general technique.

Figure 4B:
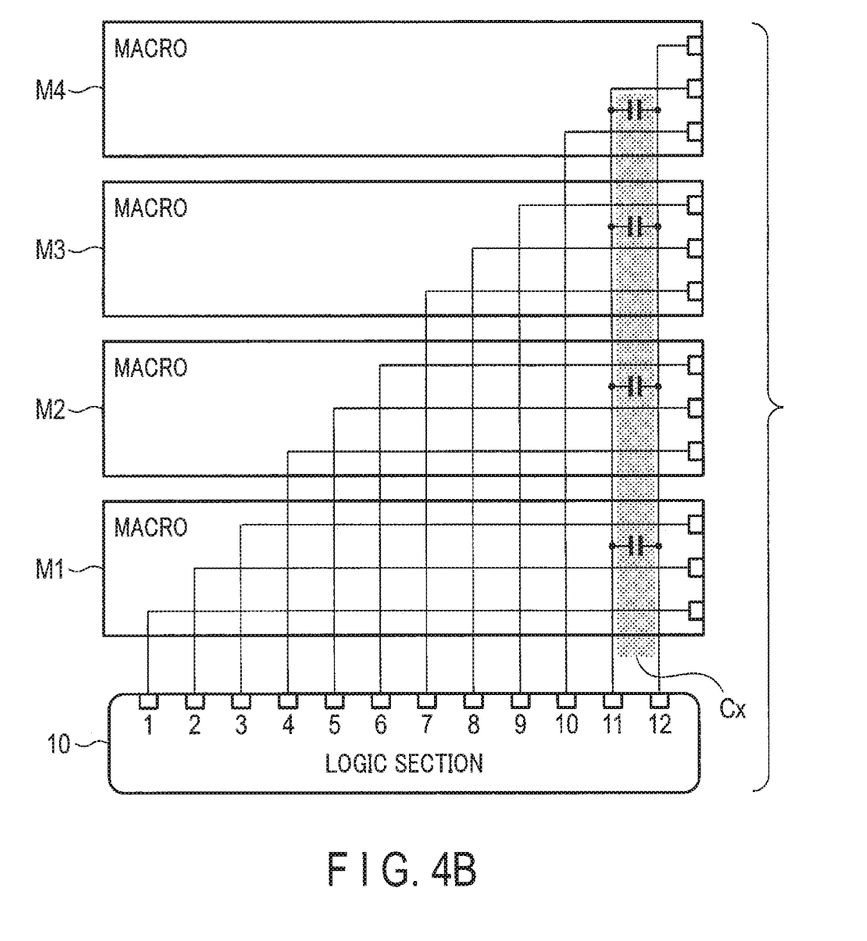
FIG. 4B is a diagram illustrating a specific example of a wiring layout in a case in which the number of stages of macros is four in a general technique.

As illustrated in FIGS. 4A and 4B, each integrated circuit includes a logic section 10 and a plurality of macros M1, M2, M3, and M4.

The nine wirings which connect the logic section 10 to the macros M1, M2, M3, and M4 have parallel running portions which extend from terminals 1 to 12 of the logic section 10 and run in parallel toward the macros M1, M2, M3, and M4. The plurality of terminals for wiring connection provided at end portions of the respective macros are linearly arranged from the logic section 10 along the direction in which the individual wirings run in parallel. The twelve wirings which extend from the logic section 10 side run in parallel on the macro M1 or the like, and each turns in mid-course toward a position at which the terminal of a corresponding macro exists so as to connect to the terminal of the corresponding macro.

In the example of FIG. 4A, any adjacent wirings in the parallel running portion (namely, any adjacent wirings at the terminals 1 to 12 of the logic section 10) are connected to different circuit blocks. On the other hand, in the example of FIG. 4B, such a wiring layout is not established. From another viewpoint, in the example of FIG. 4A, it can be said that the wirings connected from the logic section 10 to the same circuit block are separately arranged so as not to be adjacent to each other in the parallel running portion (namely, so as not to be adjacent to each other at the terminals 1 to 12 of the logic section 10). On the other hand, in the example of FIG. 4B, such a wiring layout is not established.

Wiring Method of Specific Example 3

In a case in which the number of stages of macros is four and the number of wirings is twelve (the number of wirings is three for each macro), the invention is not limited to the example of FIG. 4A and an example of 24(=factorial of four) types of wiring schemes including these examples can be provided. In the present example, illustration of the table is omitted.

Here, a case in which the individual wirings are sequentially laid in the order of the terminals 1, 2, 3, 4, 5, 6, 7, 8, 9, 10, 11, and 12 of the logic section 10 is considered. In this case, for the three terminals of each macro, for example, the wirings are sequentially connected from the terminal closer to the logic section 10.

Twenty-four types of wiring schemes include an example in which the connection destinations of the terminals 1, 2, 3, 4, . . . of the logic section 10 are "M1, M2, M3, M4/ . . . ", an example in which the connection destinations of the terminals 1, 2, 3, 4, . . . of the logic section 10 are "M1, M2, M4, M3/ . . . ", an example in which the connection destinations of the terminals 1, 2, 3, 4, . . . of the logic section 10 are "M1, M3, M2, M4/ . . . ", an example in which the connection destinations of the terminals 1, 2, 3, 4, . . . of the logic section 10 are "M1, M3, M4, M2/ . . . ", an example in which the connection destinations of the terminals 1, 2, 3, 4, . . . of the logic section 10 are "M1, M4, M2, M3/ . . . ", an example in which the connection destinations of the terminals 1, 2, 3, 4, . . . of the logic section 10 are "M1, M4, M3, M2/ . . . ", an example in which the connection destinations of the terminals 1, 2, 3, 4, . . . of the logic section 10 are "M2, M1, M3, M4/ . . . ", an example in which the connection destinations of the terminals 1, 2, 3, 4, . . . of the logic section 10 are "M2, M1, M4, M3/ . . . ", an example in which the connection destinations of the terminals 1, 2, 3, 4, . . . of the logic section 10 are "M2, M3, M1, M4/ . . . ", an example in which the connection destinations of the terminals 1, 2, 3, 4, . . . of the logic section 10 are "M2, M3, M4, M1/ . . . ", an example in which the connection destinations of the terminals 1, 2, 3, 4, . . . of the logic section 10 are "M2, M4, M1, M3/ . . . ", an example in which the connection destinations of the terminals 1, 2, 3, 4, . . . of the logic section 10 are "M2, M4, M3, M1/ . . . ", an example in which the connection destinations of the terminals 1, 2, 3, 4, . . . of the logic section 10 are "M3, M1, M2, M4/ . . . ", an example in which the connection destinations of the terminals 1, 2, 3, 4, . . . of the logic section 10 are "M3, M1, M4, M2/ . . . ", an example in which the connection destinations of the terminals 1, 2, 3, 4, . . . of the logic section 10 are "M3, M2, M1, M4/ . . . ", an example in which the connection destinations of the terminals 1, 2, 3, 4, . . . of the logic section 10 are "M3, M2, M4, M1/ . . . ", an example in which the connection destinations of the terminals 1, 2, 3, 4, . . . of the logic section 10 are "M3, M4, M1, M2/ . . . ", an example in which the connection destinations of the terminals 1, 2, 3, 4, . . . of the logic section 10 are "M3, M4, M2, M1/ . . . ", an example in which the connection destinations of the terminals 1, 2, 3, 4, . . . of the logic section 10 are "M4, M1, M2, M3/ . . . ", an example in which the connection destinations of the terminals 1, 2, 3, 4, . . . of the logic section 10 are "M4, M1, M3, M2/ . . . ", an example in which the connection destinations of the terminals 1, 2, 3, 4, . . . of the logic section 10 are "M4, M2, M1, M3/ . . . ", an example in which the connection destinations of the terminals 1, 2, 3, 4, . . . of the logic section 10 are "M4, M2, M3, M1/ . . . ", an example in which the connection destinations of the terminals 1, 2, 3, 4, . . . of the logic section 10 are "M4, M3, M1, M2/ . . . ", and an example in which the connection destinations of the terminals 1, 2, 3, 4, . . . of the logic section 10 are "M4, M3, M2, M1/ . . . ".

Among these twenty-four types of wiring schemes, an example of "M2, M3, M1, M4/ . . . " corresponds to the example of FIG. 4A.

In various wiring schemes according to the present example, there are no portions in which M1 is successive, such as "M1, M1" or "M1/M1", there is no portions in which M2 is successive, such as "M2, M2" or "M2/M2", there is no portions in which M3 is successive, such as "M3, M3" or "M3/M3", and there is no portions in which M4 is successive, such as "M4, M4" or "M4/M4". Therefore, any adjacent wirings in the parallel running portion (namely, any adjacent wirings at the terminals 1 to 12 of the logic section 10) are connected to different circuit blocks. In addition, the wirings connected from the logic section 10 to the same circuit block are separately arranged so as not to be adjacent to each other in the parallel running portion (namely, so as not to be adjacent to each other at the terminals 1 to 12 of the logic section 10).

Any of the various wiring schemes according to the present example may be adopted, but in order to further enhance the operation performance of the integrated circuit, those having the largest maximum interline capacitance Cx can be excluded from candidates among the various wiring schemes, and those having the smallest maximum interline capacitance Cx may be adopted among the various wiring schemes.

Operation Effect by Specific Example 3

In the example of FIG. 4A, among the plurality of adjacent wirings, the wirings which extend from the terminals 9 and 10 of the logic section 10 or the wirings which extend from the terminals 8 and 9 have the longest parallel running distance, and the interline capacitance corresponds to the maximum interline capacitance Cx.

On the other hand, in the example of FIG. 4B, among the plurality of adjacent wirings, the wirings which extend from the terminals 11 and 12 of the logic section 10 have the longest parallel running distance, and the interline capacitance corresponds to the maximum interline capacitance Cx.

It can be estimated that, in the example of FIG. 4A, the two wirings which extend from the terminals 9 and 10 of the logic section 10 run substantially in parallel for "two macros", and in the example of FIG. 4B, the two wirings which extend from the terminals 11 and 12 of the logic section 10 run substantially in parallel for "four macros".

Since the maximum interline capacitance Cx in the example of FIG. 4A is about one half of that in the example of FIG. 4B, the crosstalk noise and the signal transmission delay are reduced by that amount. Therefore, in a case in which the number of stages of macros is four and the number of wirings is twelve (the number of wirings is three for each macro), the operation performance of the integrated circuit can be improved by designing the wiring layout as in the example of FIG. 4A. This is not limited to the example of FIG. 4A, and it can be said that this is almost common to the twenty-four types of various methods described above.

(Layout Design Method)

Figure 5:
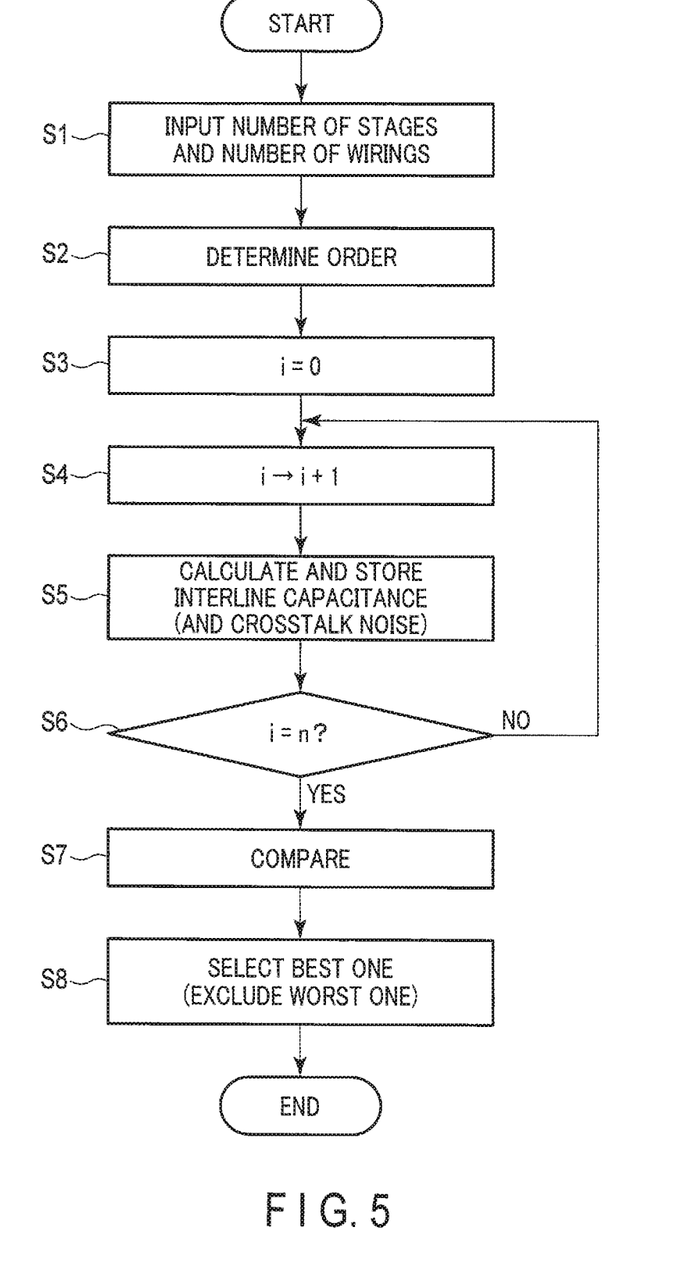
FIG. 5 is a flowchart illustrating an example of a layout design method for designing a wiring layout of an integrated circuit according to the same embodiment.

Next, an example of a layout design method for designing a wiring layout of an integrated circuit according to the present embodiment will be described with reference to FIG. 5.

The design of the wiring layout described herein can be implemented by a computer, and each procedure can be realized as a program to be executed by the computer.

First, information such as the number of stages, the number of columns, the total number of wirings, the number of wirings for each macro, and the like of the macros M1, . . . arranged in the integrated circuit is input to the computer (step S1).

For simplicity of explanation, it is assumed that the number of columns of the macros M1, . . . is one.

Next, the connection destinations of the terminals 1, 2, 3, . . . of the logic section 10 are sequentially determined based on the input information (step S2).

For example, when the number of stages of the macros M1, . . . is three, the total number of wirings is nine, and the number of wirings for each macro is three, the connection order of six wiring schemes as illustrated in FIG. 3C is determined as a candidate, and furthermore, the wiring layout based on each connection order is determined.

Here, in order to connect adjacent wirings in the above-described parallel running portion to different circuit blocks, the circuit blocks to be the connection destinations of the respective wirings running in parallel from the logic section 10 are respectively determined, and furthermore, the layout of each wiring is determined so that each wiring is connected to the determined circuit block of the connection destination.

These pieces of the determined information are stored in a predetermined storage area.

Next, a process of calculating and storing the maximum interline capacitance Cx (and crosstalk noise thereof) is performed for each wiring scheme (steps S3 to S6).

For example, a count value i representing the number of the wiring scheme is held in a counter, and i=0 is set as an initial value at the beginning (step S3). By successively adding 1, the maximum interline capacitance Cx for each wiring scheme is calculated, a crosstalk noise is, if necessary, further calculated, and the calculation result is stored in a predetermined storage area (steps S4 and S5). This process is repeated until the count value i reaches i=n (step S6).

After calculating the maximum interline capacitance Cx and the like for each wiring scheme, the respective calculation results are compared (step S7). Among the various wiring schemes, the wiring scheme having the smallest maximum interline capacitance Cx or crosstalk noise thereof (the best wiring scheme) is adopted (step S8). Alternatively, the wiring scheme having the largest maximum interline capacitance Cx or crosstalk noise thereof (the worst wiring scheme) is excluded from the candidate.

As described above, the connection order and the wiring layout of the appropriate wiring scheme are determined.

(Crosstalk Noise Calculation Method)

Next, an example of a crosstalk noise calculation method will be described with reference to FIG. 6.

Figure 6:
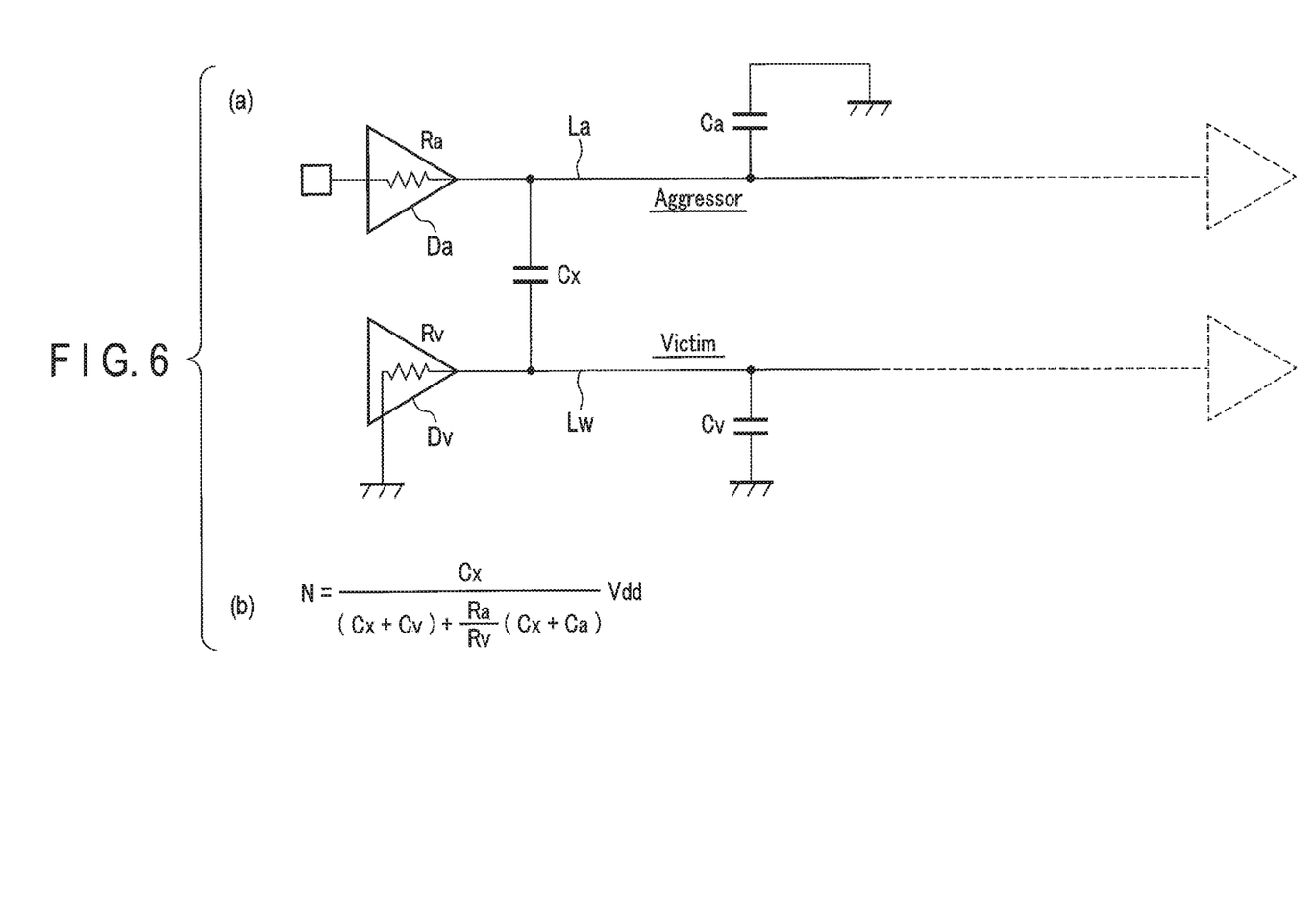
FIG. 6 is a diagram illustrating an example of a model with calculation formula for explaining a crosstalk noise calculation method.

FIG. 6 (a) is a diagram illustrating an example of a model including various parameters used for calculation of crosstalk noise. FIG. 6 (b) is a diagram illustrating an example of a calculation formula for obtaining crosstalk noise based on the model illustrated in FIG. 6 (a). Here, the maximum interline capacitance Cx will be referred to as "interline capacitance Cx" and will be described.

In the model illustrated in FIG. 6 (a), it is assumed that, among the two adjacent wirings La and Lw, the wiring La corresponds to an aggressor on the side which affects crosstalk, and the wiring Lw corresponds to a victim on the side which is affected by crosstalk.

The interline capacitance between the wirings La and Lw are Cx. Here, an equivalent resistance of a driver Da on the wiring La side is Ra, and an equivalent resistance of a driver Dv on the wiring Lw side is Rv. In addition, a interline capacitance between the wiring La and another wiring or the like is Ca, and a interline capacitance between the wiring Lw and another wiring or the like is Cv.

In such a model, it is assumed that a step input changing from 0 v to Vdd is applied to the driver Da of the wiring La as an aggressor. In this case, a crosstalk noise N appearing in the wiring Lw which is the victim is obtained by the formula shown in FIG. 6 (b).

(Crosstalk Noise Reduction Effect)

The crosstalk noise reduction effect according to the present embodiment will be described by using the model and formula described with reference to FIG. 6.

Here, according to the above-described configuration example (for example, the example of FIG. 2A or the example of FIG. 4A), the crosstalk noise reduction amount when the maximum interline capacitance Cx between the wiring La which is the aggressor and the wiring Lw which is the victim is about one half of that in the case of the general technique is verified.

Therefore, assuming that the interline capacitance Cx with a general technique is "c" and the interline capacitance Cx according to the present embodiment is "0.5 c", the respective crosstalk noises are obtained.

The crosstalk noise when the interline capacitance Cx is "c" is N1 and the crosstalk noise when the interline capacitance Cx is "0.5 c" is N2.

For the calculation of the crosstalk noises N1 and N2, the formula of the crosstalk noise N shown in FIG. 6 (b) is used, but it is defined as follows so as to simplify the calculation.

$$Ra/Rv=R$$

$$Ca=Cv=c$$

When defined as above, the crosstalk noises N1 and N2 can be obtained as follows.

$$N1=Vdd \cdot c/(2c+R \cdot 2c)=Vdd/(2+2R)$$

$$N2=Vdd \cdot 0.5c/(1.5c+R \cdot 1.5)=Vdd/(3+3R)$$

Therefore, the crosstalk noise N2 is "two-thirds" (approximately 0.67 times) of the crosstalk noise N1, and it was able to be confirmed that a large crosstalk noise reduction effect is obtained.

Although the effect of suppressing the signal transmission delay will not be described herein in detail, it is obvious that if the interline capacitance Cx becomes, for example, ½, the signal transmission delay will be reduced by that amount.

As described above, according to the present embodiment, at least the maximum interline capacitance can be made smaller than that of the general technique, and the crosstalk noise and the signal transmission delay can be reduced. Therefore, the operation performance of the integrated circuit can be improved.

In the above-described embodiment, the case in which the number of terminals of each macro is the same is shown in any of the examples, but macros which are different in the number of terminals of the macro may be included. Even in this case, as with the case in which the number of terminals of each macro is the same, a wiring layout satisfying the above-described structural conditions may be adopted. If it is impossible to satisfy the corresponding condition and, for example, it is impossible to avoid the appearance of adjacent portions of wirings connected to the same macro in the parallel running portion, it is preferable that the wiring layout is made such that the maximum interline capacitance between the adjacent wirings is minimized.

As described above in detail, according to the embodiments, it is possible to suppress the crosstalk noise and the like caused by interline capacitance and improve the operation performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. An integrated circuit comprising:
a circuit provided with terminals;
a plurality of circuit blocks provided with terminals; and
a plurality of wirings that run in parallel from the terminals of the circuit toward the circuit blocks and each turns in mid-course toward a position at which a terminal of a corresponding circuit block exists to connect to the terminal of the corresponding circuit block, wherein
the circuit blocks are arranged along a direction in which the wirings run in parallel from the circuit, and terminals of each circuit block are arranged along a direction in which the wirings run in parallel from the circuit,
the terminals of the circuit are arranged along a direction perpendicular to a direction in which the terminals of each circuit block are arranged, and
any adjacent wirings at the terminals of the circuit are connected to different circuit blocks.

2. The integrated circuit according to claim 1,
wherein wirings connected from the circuit to the same circuit block are separately arranged so as not to be adjacent to each other at the terminals of the circuit.

3. The integrated circuit according to claim 1,
wherein the circuit is a circuit corresponding to a logic area, and
each of the circuit blocks is a circuit corresponding to a macro.

4. A layout design method for an integrated circuit including a circuit provided with terminals, a plurality of circuit blocks provided with terminals, and a plurality of wirings that run in parallel from the terminals of the circuit toward the circuit blocks and each turns in mid-course toward a position at which a terminal of a corresponding circuit block exists to connect to the terminal of the corresponding circuit block, wherein the circuit blocks are arranged along a direction in which the wirings run in parallel from the circuit, and terminals of each circuit block are arranged along a direction in which the wirings run in parallel from the circuit, and the terminals of the circuit are arranged along a direction perpendicular to a direction in which the terminals of each circuit block are arranged, the layout design method comprising:
determining circuit blocks to be connection destinations of respective wirings that run in parallel from the circuit so that any adjacent wirings at the terminals of the circuit are connected to different circuit blocks; and
determining the arrangement of the respective wirings so that the respective wirings are connected to the determined circuit blocks of the connection destinations.

5. The layout design method according to claim 4,
wherein the arrangement of the respective wirings are determined so that the wirings connected from the circuit to the same circuit block are not adjacent to each other at the terminals of the circuit.

6. The layout design method according to claim 4, comprising:
obtaining a plurality of connection relationships between each of the wirings that runs in parallel from the circuit and the circuit blocks; and
selecting a connection relationship that has a smallest maximum interline capacitance from the obtained connection relationships.

7. The layout design method according to claim 4, comprising:
obtaining a plurality of connection relationships between each of the wirings that runs in parallel from the circuit and the circuit blocks; and
excluding a connection relationship that has a largest maximum interline capacitance from the obtained connection relationships.

* * * * *